(12) United States Patent
Inui

(10) Patent No.: US 7,893,721 B2
(45) Date of Patent: Feb. 22, 2011

(54) DUAL RAIL DOMINO CIRCUIT AND LOGIC CIRCUIT

(75) Inventor: Shigeto Inui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/528,572

(22) PCT Filed: Feb. 15, 2008

(86) PCT No.: PCT/JP2008/052529

§ 371 (c)(1),
(2), (4) Date: Aug. 25, 2009

(87) PCT Pub. No.: WO2008/105243

PCT Pub. Date: Sep. 4, 2008

(65) Prior Publication Data

US 2010/0045344 A1    Feb. 25, 2010

(30) Foreign Application Priority Data

Feb. 26, 2007   (JP) .............................. 2007-046225

(51) Int. Cl.
*H03K 19/00* (2006.01)
(52) U.S. Cl. ........................................ 326/93; 326/119
(58) Field of Classification Search ............. 326/93–98, 326/112, 191, 121
See application file for complete search history.

(56) References Cited

U.S. PATENT DOCUMENTS

| 5,258,666 | A | * | 11/1993 | Furuki | 326/106 |
| 5,572,151 | A | * | 11/1996 | Hanawa et al. | 326/113 |
| 6,426,652 | B1 | * | 7/2002 | Greenhill et al. | 326/83 |
| 6,949,954 | B2 | * | 9/2005 | Nystrom et al. | 326/93 |
| 7,710,155 | B2 | * | 5/2010 | Bhatia et al. | 326/93 |

FOREIGN PATENT DOCUMENTS

| JP | 11-261406 A | 9/1999 |
| JP | 2000-013216 A | 1/2000 |
| JP | 2004-173273 A | 6/2004 |
| JP | 2006-253242 A | 9/2006 |
| WO | 2004-102807 A1 | 11/2004 |

OTHER PUBLICATIONS

International Search Report for PCT/JP2008/052529 mailed May 1, 2008.

* cited by examiner

*Primary Examiner*—Don P Le

(57) ABSTRACT

In a dual rail domino circuit 3 using a combination of a domino circuit 1 for outputting positive logic and a domino circuit 2 for outputting negative logic, an AND 4 and a NAND 5 as members for simultaneously fixing an output of the domino circuit 1 and an output of the domino circuit 2 at a low level in an evaluation phase are provided, and a logical AND of a gating control signal and an input signal is inputted to the domino circuit 1 and a logical NOT of the logical AND of the gating control signal and the input signal is inputted to the domino circuit 2.

4 Claims, 5 Drawing Sheets

F I G. 6
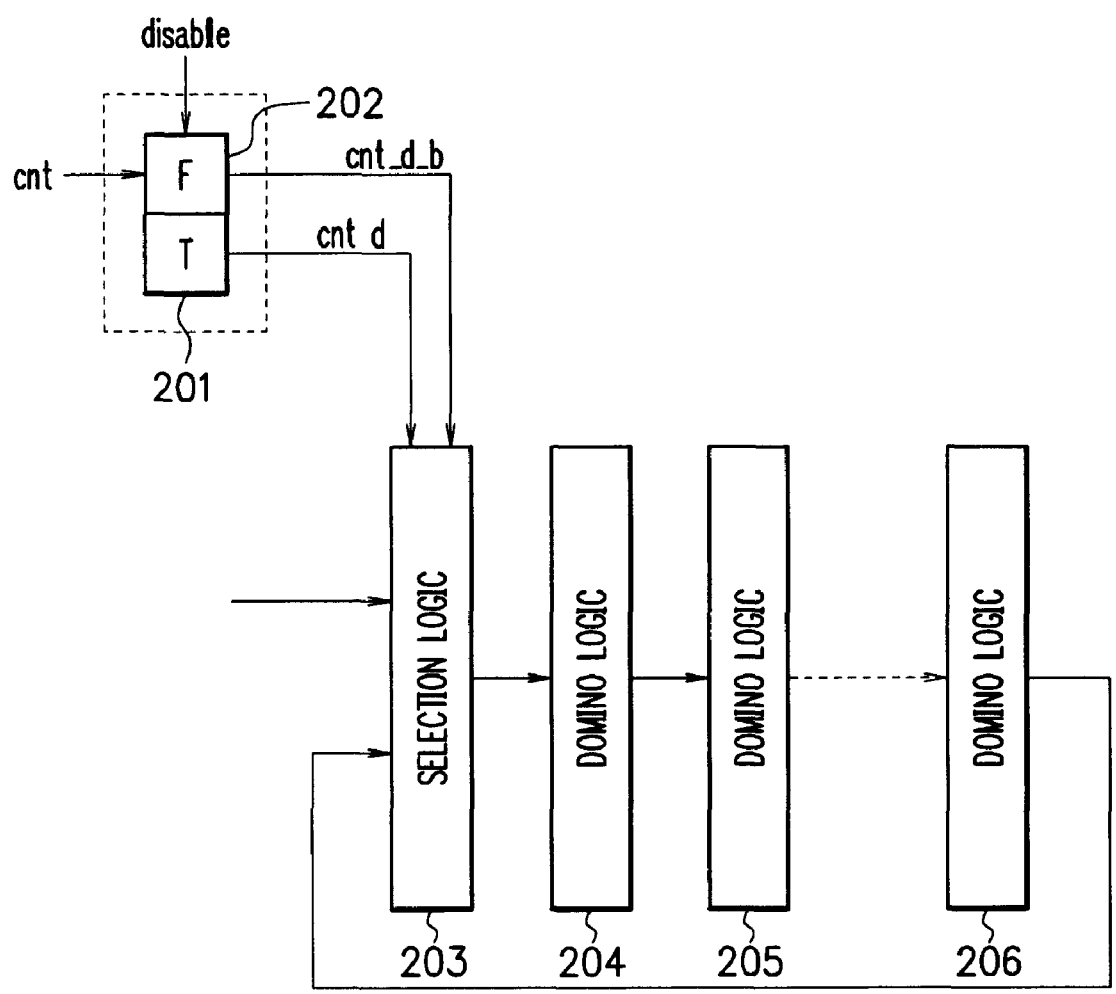

US 7,893,721 B2

DUAL RAIL DOMINO CIRCUIT AND LOGIC CIRCUIT

This application is the National Phase of PCT/JP2008/052529, filed Feb. 15, 2008, and is based upon and claims the benefit of priority from Japanese patent application No. 2007-046225, filed on Feb. 26, 2007, the disclosure of which is incorporated herein in its entirety by reference.

TECHNICAL FIELD

The present invention relates to a digital circuit, and particularly to a logic circuit with reduced power consumption.

BACKGROUND ART

With a recent increase in the operation speed of an LSI, domino circuits are widely used as a means for increasing the operation speed of the LSI. Techniques related to the domino circuits include, e.g., "DOMINO CIRCUIT ARRANGEMENT" in Patent Document 1 and "SEMICONDUCTOR INTEGRATED CIRCUIT DEVICE AND ITS DESIGNING METHOD" in Patent Document 2.

The domino circuits are logic circuits that alternately perform two phases, which are (1) precharge using a clock (precharge phase) and (2) discharge by logic evaluation using an nMOS logic (evaluation phase), once during each clock cycle in synchronization with the clock.

Since the domino circuits do not use a pMOS in the logic evaluation as described in the above-mentioned (2), it is known that the domino circuits are higher in speed than typical static CMOS circuits.

On the other hand, as described in the above-mentioned (1), since the precharge operation is inevitably performed during each cycle in synchronization with the clock, power is consumed in each cycle. In other words, since the static CMOS circuits do not need clock signals for the operations thereof, the power is not consumed unless input signals operate. In contrast, the power consumption of the domino circuits is relatively large.

FIG. 1 shows a structure of the domino circuit. The domino circuit includes a pMOS transistor 101 for performing precharge, an nMOS 102 logic circuit for performing logic evaluation, and an inverter 103 to be added to an output. In the evaluation phase, the nMOS 102 logic circuit is appropriately turned ON when an input signal rises, performs discharge when logic is true, and holds the charge when the logic is false.

In this case, because the nMOS logic circuit 102 only includes a function of either discharging the charge or holding the charge, it is impossible to perform recharging in the evaluation phase if a charge once has been discharged, and it is necessary to wait for the next precharge phase in order to perform the recharging.

This means that the input signal of the nMOS is allowed only to make a transition in a rise direction in the evaluation phase, and not allowed to make a transition in a fall direction. This is because the transition in the fall direction means that the nMOS needs to be in an ON state (i.e., discharge state) from the start. Thus, it is impossible to perform the charging when the input signal falls as described above, and to perform the correct logic evaluation. A property in which the transition of the signal is performed only in the rise direction is called a monotonic property, and the monotonic property needs to be insured for the input signal of the domino circuit.

In a connection between the domino circuits, an effective method for insuring the monotonic property is a dual rail domino logic. A structure of the dual rail domino circuit is shown in FIG. 2. Signals indicated by "clk" in the drawing denote a clock signal which is distributed and inputted to all domino circuits. However, in order to avoid complication of the drawing, each of the signals is independently illustrated and is designated by the "clk". In other words, the signals are independently illustrated in the drawing, but the same signal is actually distributed.

In the drawing, a dual rail domino circuit 112 includes typical domino circuits 110 and 111. The domino circuit 110 outputs High when the logic to be evaluated is true. In other words, the domino circuit 110 is based on positive logic. On the other hand, the domino circuit 111 outputs High when the logic to be evaluated is false. In other words, the domino circuit 111 is based on negative logic. To the domino circuits 111 and 112, arbitrary input signals In0 to InN (N is an arbitrary natural number) and their inverted signals are inputted.

Therefore, when the result of the evaluation is true, the output of the domino circuit 110 becomes High, while the output of the domino circuit 111 continues to be Low. On the other hand, when the result of the evaluation is false, conversely to the case shown above, the output of the domino circuit 111 becomes High, while the output of the domino circuit 110 continues to be Low. Due to this operation, the output signals unfailingly rise irrespective of whether the logic is the positive logic or the negative logic so that it becomes possible to safely compose the circuit using the domino circuit.

As described above, the dual rail domino circuit is an effective method for safely constructing the circuit when composing the domino circuit. However, since the circuit requires implementation of both of the positive logic and the negative logic, a power overhead is large. A method often used to suppress the power consumption includes a gating method.

The typical method is a method called clock gating. The clock gating is a method in which a logic circuit for selectively stopping the clock signal is incorporated in a clock generation/distribution circuit, and the supply of the clock signal to a block which is not required to use during the operation of the LSI is stopped so that the power consumption in the block is suppressed.

Because the clock as the basic signal for operating the logic circuit is stopped, it is possible to stop the operation irrespective of whether the target logic circuit is a typical CMOS logic circuit or the domino circuit.

In addition, when the clock can not be stopped for some reason (when the clock gating method can not be applied), it is possible to stop only data. This is a method in which a logical AND is generated using a gating control signal and the corresponding signal (data signal) and the transition of the corresponding signal is stopped when the gating control signal is disable. Because the present method does not have a commonly used name, the method will be described as a "data gating method" in the present description.

A structure of the domino circuit to which the data gating method is applied is shown in FIG. 3. There is adopted the structure in which target domino circuits 131, 132, 133, construct a stage 130, and a next stage 140 subsequent thereto is successively arranged. In order to apply the data gating method, a gating logic circuit 120 for implementing the logical AND of a gating control signal disable and the data signal is incorporated immediately previous to the stage 130, and it is possible to forcibly bring all signals into Low using the control signal disable. The signals fixed to be Low are propagated to the stage 130 to fix the output thereof to be Low. This operation is successively propagated to individual stages and all circuits are eventually stopped. The data gating can be achieved by this implementation.

The data gating method does not contribute to the power reduction in the clock distribution system when compared with the clock gating method. However, the data gating method allows control on a per signal basis so that it is possible to perform exacting control.

In addition, in the clock gating method, all logic circuits are simultaneously stopped. On the other hand, data is successively stopped in the data gating method. As a result, a noise in a power network is also reduced.

Patent Document 1: Japanese Unexamined Patent Publication No. 2004-173273
Patent Document 2: Japanese Unexamined Patent Publication No. 2006-253242

DISCLOSURE OF THE INVENTION

Problems to be Solved by the Invention

However, a combination of the dual rail domino circuit and the gating method has several problems.

The first problem is the noise occurring in the power network during the execution of gating in the combination of the dual rail domino circuit and the clock gating method. The cause of this problem is that, by stopping the clock using the clock gating, target blocks are simultaneously stopped and the power consumption in the entire circuits is suddenly changed.

The second problem is an increase in the amount of hardware in the combination of the dual rail domino circuit and the data gating method. The cause of the problem is that it is necessary to prepare additional hardware for generating the logical AND of the signal and the gating control signal for all signals.

Thus, the domino circuit in which the occurrence of the noise during gating is suppressed and the increase in the amount of hardware required to implement the gating logic is also suppressed has not been implemented.

The present invention has been achieved in view of these problems, and it is an object of the present invention to provide a logic circuit in which the occurrence of the noise during gating is suppressed and the increase in the amount of hardware required to implement the gating logic is also suppressed, and a dual rail domino circuit and a domino circuit used therefor.

Means for Solving Problem

In order to achieve the above-mentioned object, the present invention provides, as the first aspect, a dual rail domino circuit using a combination of a first domino circuit for outputting positive logic and a second domino circuit for outputting negative logic, including a member for simultaneously fixing an output of the first domino circuit and an output of the second domino circuit at a low level in an evaluation phase in response to a gating control signal inputted from an outside. In the first aspect of the present invention, a logical AND of the gating control signal and an input signal is preferably inputted to the first domino circuit, and a logical NOT of the logical AND of the gating control signal and the input signal is preferably inputted to the second domino circuit.

In addition, in order to achieve the above-mentioned object, the present invention provides, as the second aspect, a domino circuit including a member for fixing an output in an evaluation phase at a low level when a signal inputted from a dual rail domino circuit at a previous stage is fixed at the low level. In the second aspect of the present invention, a logical AND of the signal inputted from the dual rail domino circuit at the previous stage and an arbitrary signal is preferably outputted.

Further, in order to achieve the above-mentioned object, the present invention provides, as the third aspect, a logic circuit including at least one stage of a domino circuit connected at a stage subsequent to the dual rail domino circuit according to any configuration of the above-mentioned first aspect of the present invention, wherein the domino circuit immediately subsequent to the dual rail domino circuit is the domino circuit according to any configuration of the above-mentioned second aspect of the present invention, and an output of the domino circuit at the subsequent stage is successively fixed at a low level when the output of the dual rail domino circuit is fixed at the low level.

In the third aspect of the present invention, the domino circuit preferably forms a selection logic circuit and the selection logic circuit is preferably controlled by the output of the dual rail domino circuit. In addition, a plurality of stages of third domino circuits are preferably connected at subsequent stages.

Effect of the Invention

In accordance with the present invention, it is possible to provide a logic circuit in which the occurrence of the noise during gating is suppressed and an increase in the amount of hardware required to implement the gating logic is also suppressed, and a dual rail domino circuit and a domino circuit used therefor.

BEST MODE FOR CARRYING OUT THE INVENTION

First Exemplary Embodiment

A description will be given to a first exemplary embodiment in which the present invention is preferably implemented.

FIG. 4 shows a structure of a semiconductor circuit according to the first exemplary embodiment in which the present invention is preferably implemented. A dual rail domino circuit 3 includes a domino circuit 1 to which a control signal cnt is inputted and which outputs positive logic, a domino circuit 2 which outputs negative logic of the control signal cnt, an AND circuit 4 which generates a logical AND of a disable signal and the control signal cnt, and a NAND circuit 5 which generates the negative logic of the logical AND. The logical AND of the disable signal and the control signal cnt is inputted to the domino circuit 1, while the negative logic of the logical AND of the disable signal and the control signal cnt is inputted to the domino circuit 2.

Signals indicated by "clk" in the drawing denote a clock signal which is distributed and inputted to all domino circuits. However, in order to prevent complication of the drawing, each of the signals is independently illustrated and designated by the "clk". In other words, each of the signals is independently illustrated in the drawing but, actually, the same signal is distributed and distributed.

During a normal operation, the disable signal is 1, with regard to the outputs of the dual rail domino circuit 3, the positive logic of the cnt is outputted from the domino circuit 1, while the negative logic of the cnt is outputted from the domino circuit 2. That is, the outputs of the dual rail domino circuit 3 are either (0, 1) or (1, 0). This operation is the same as the operation of a typical dual rail domino circuit. The outputs of the dual rail domino circuit 3 are inputted to another domino circuit 6.

The domino circuit 6 is based on selection logic which selectively operates with the outputs of the dual rail domino circuit 3. Accordingly, during the normal operation, the domino circuit 6 operates to selectively output the result of two types of logical operations according to the outputs of the dual rail domino circuit 3. The output of the domino circuit 6 is successively propagated to domino circuit 7 and to domino circuit 8. The domino circuits 7 and 8 are based on arbitrary domino logic, and do not need to be based on the selection logic.

Next, a description will be given to the operation during data gating. During the data gating, the disable signal is 0, and the outputs of the dual rail domino logic 3 are (0, 0) irrespective of the state of the cnt. The logic implemented by the domino circuit 6 is the selection logic, and the domino circuit 6 operates to output either of two types of logics according to the outputs of the dual rail domino circuit 3. That is, because the domino circuit 6 operates so as to generate the logical AND with the outputs of the dual rail domino circuit 3, when all of the outputs of the dual rail domino circuit 3 become 0, the output thereof is inevitably fixed to be 0. Thereafter, the value is successively propagated to the domino circuit 7 and to the domino circuit 8 to eventually stop all of the domino circuits.

In the dual rail domino circuit such as the related art, the output signal thereof includes only (0, 1) or (1, 0). However, in the present embodiment, because the dual rail domino circuit 3 is structured to be allowed to have a state of (0, 0), the data gating can be implemented without reconfiguring the circuits subsequent to the dual rail domino circuit 3. Accordingly, a circuit configuration which needs to be added in order to implement the gating function is extremely suppressed. In addition, since the stoppage state is successively propagated to the domino circuits which are connected in cascade, the noise occurring in the power network is significantly reduced when compared with the case of the clock gating in which the circuits are simultaneously stopped.

In the present embodiment, the case where the domino circuit 6 is selection logic circuit is taken as an example. However, as long as the logic implemented by the domino circuit 6 is structured to generate the logical AND of the outputs of the dual rail domino circuit 3 and another input signal, arbitrary logic may be used.

Second Exemplary Embodiment

A description will be given to a second exemplary embodiment in which the present invention is preferably implemented. FIG. 5 shows a structure of a dual rail domino circuit according to the present embodiment. As in the case with the first exemplary embodiment, a structure is adopted in which the output signal is allowed to have the state of (0, 0).

A dual rail domino circuit 13 includes a domino circuit 11 to which the control signal cnt is inputted and which outputs the positive logic of the control signal cnt, a domino circuit 12 which outputs the negative logic of the control signal cnt, and an inverter 14 which generates the negative logic of the control signal.

During the normal operation, the disable signal is 1 and, with regard to the outputs of the dual rail domino circuit 13, the positive logic of the cnt is outputted from the domino circuit 11, while the negative logic of the cnt is outputted from the domino circuit 12. That is, the outputs of the dual rail domino circuit 13 are either (0, 1) or (1, 0). During the data gating, the disable signal is 0, and the outputs of the dual rail domino logic 3 are (0, 0) irrespective of the state of the cnt. Accordingly, by connecting the domino circuit equivalent to the domino circuit 6 of the first exemplary embodiment, the data gating function can be implemented.

Third Exemplary Embodiment

A description will be given to a third exemplary embodiment in which the present invention is preferably implemented. FIG. 6 shows a structure of a semiconductor circuit according to the present embodiment. A selection control circuit 201 is a dual rail domino circuit and, similarly to the dual rail domino circuit 3 in the first exemplary embodiment and the dual rail domino circuit 13 in the second exemplary embodiment, the selection control circuit 201 includes a domino circuit 201 for generating the positive logic and a domino circuit 202 for generating the negative logic. A selection control signal sel and a gating control signal disable are inputted to the domino circuits 201 and 202, and the domino circuits 201 and 202 output a positive logic signal cnt_d and a negative logic signal cnt_d_b of the selection control signal. The cnt_d and the cnt_d_b are inputted to a selection logic circuit 203. The selection logic circuit 203 outputs either the input from the outside or the output of a domino circuit group 206. The output of the logic selection circuit 203 is inputted to a domino circuit group 204, and then successively propagated up to the domino circuit group 206.

In the present embodiment, during the normal operation, the cnt_d and the cnt_d_b are either in the state of (0, 1) or (1, 0) and, depending on the state, the logic selection circuit 203 selects and outputs either the input from the outside or the output of the domino circuit group 206. The setting, which one is to be selected in which state, is arbitrary. Such an operation is adopted in a floating point unit or the like, and is shown in, e.g., FIG. 2 and FIG. 5 in IEEE JOURNAL OF SOLID-STATE CIRCUITS, VOL. 32, No. 3, March 1997, "Floating-Point Datapaths with Online Built-In Self Speed Test".

During the gating operation, the cnt_d and the cnt_d_b have the value of (0, 0). The logic selection circuit 203 does not select any input, and all outputs are fixed to be Low. Thereafter, in stages 204 and 205, the output is successively fixed to be a Low signal and all domino circuits are eventually stopped.

When compared with the example of the data gating shown in FIG. 3, in the present embodiment, since the gating control signal is inputted only to the selection control logic circuit 201 and it is not necessary to distribute the signal to other data, the amount of hardware added in order to implement the data gating is minimized. In particular, even in a case where the target signal to be selected ranges from several tens to several hundred bits such as the floating point unit, because it is sufficient to add hardware only to the selection logic circuit, it is possible to suppress an increase in the circuit area.

It is to be noted that each of the exemplary embodiments described above is one example of the preferred embodiments of the present invention, and the present invention is not limited thereto. It will be understood that various modifications may be made.

BRIEF DESCRIPTION OF THE DRAWINGS

FIG. 6 is a view showing a structure of a semiconductor circuit according to a third exemplary embodiment in which the present invention is preferably implemented.

Figure 1:
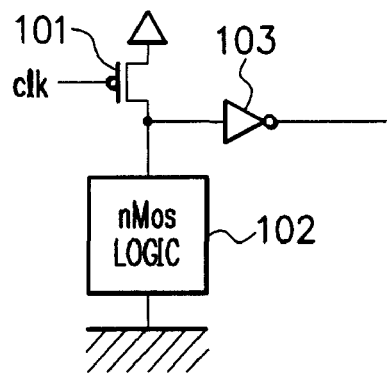
FIG. 1 is a view showing a structure of a domino circuit.
Figure 2:
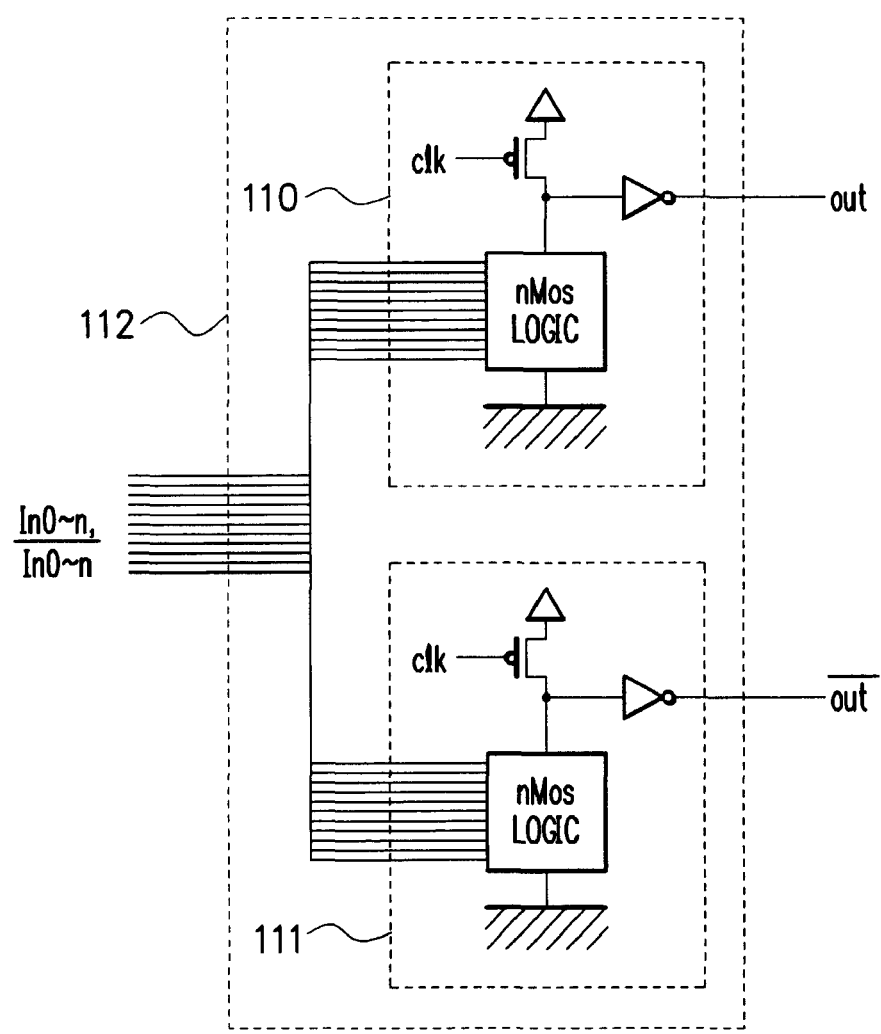
FIG. 2 is a view showing a structure of a dual rail domino circuit.
Figure 3:
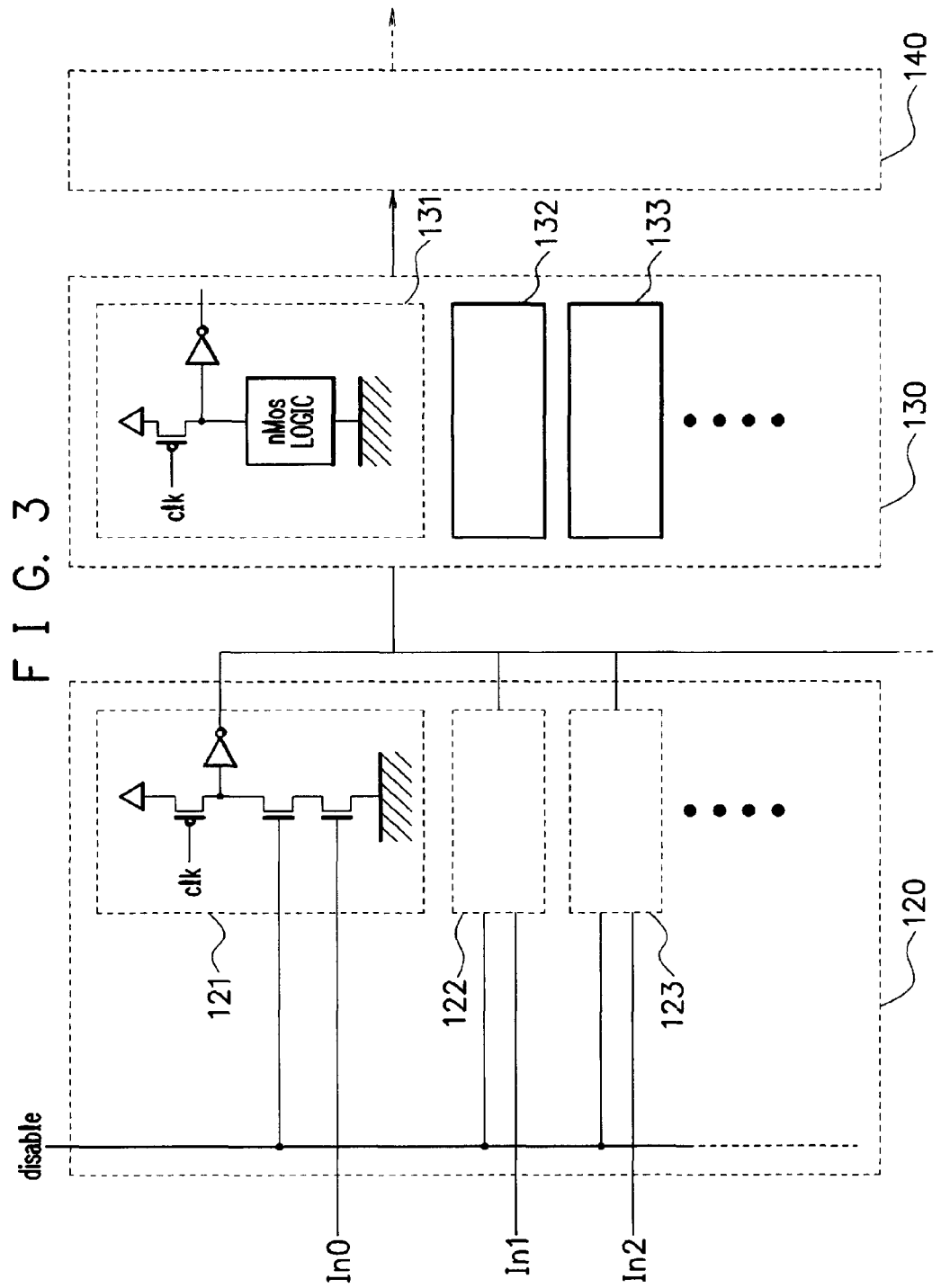
FIG. 3 is a view showing one example of data gating.
Figure 4:
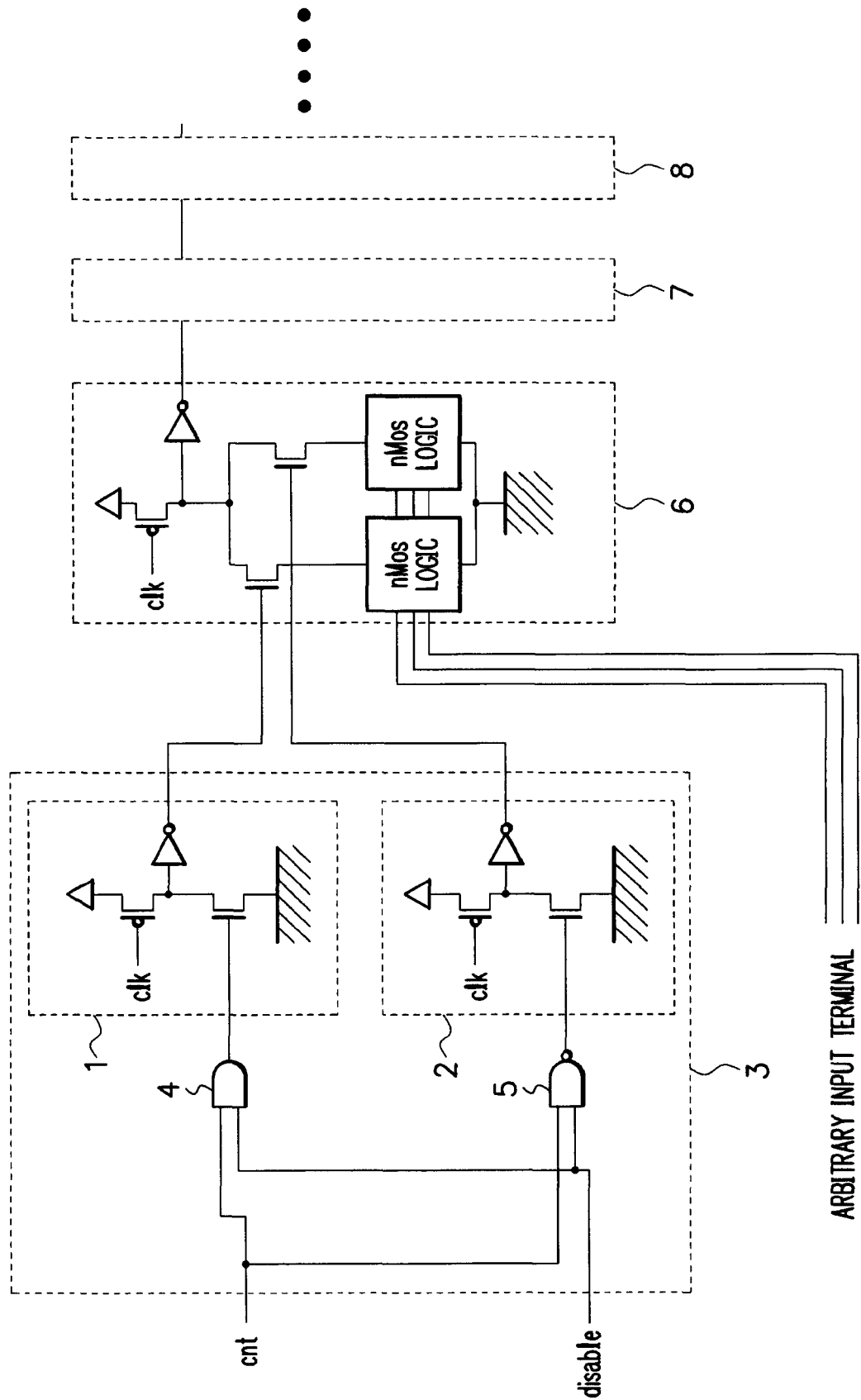
FIG. 4 is a view showing a structure of a dual rail domino circuit according to a first exemplary embodiment in which the present invention is preferably implemented.
Figure 5:
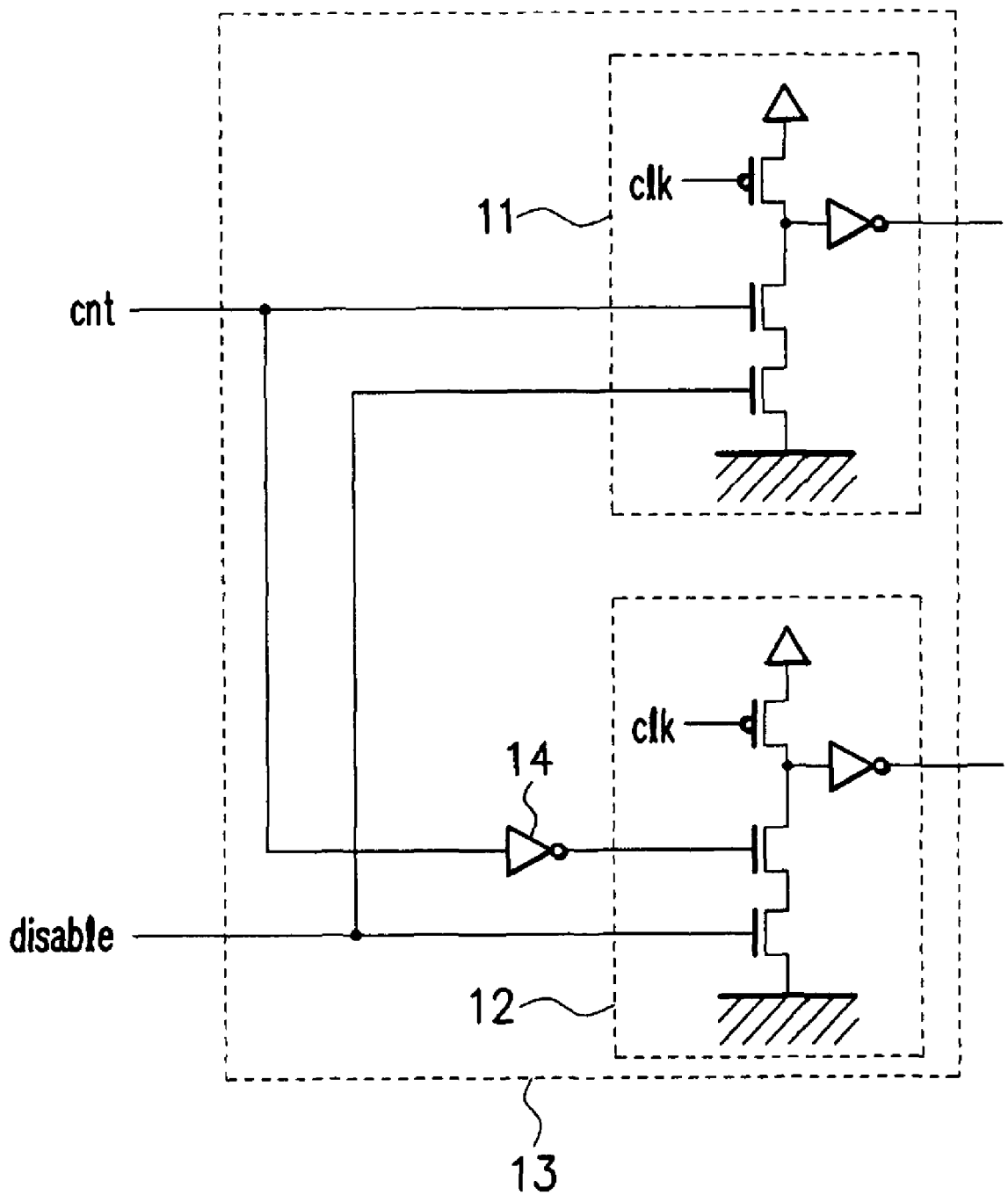
FIG. 5 is a view showing a structure of a dual rail domino circuit according to a second exemplary embodiment in which the present invention is preferably implemented.

EXPLANATIONS OF LETTERS OR NUMERALS 1, 11, 201 domino circuit for outputting positive logic
2, 12, 202 domino circuit for outputting negative logic
3, 13, 200 dual rail domino circuit
4 AND
5 NAND
6, 7, 8 domino circuit
14 inverter
203 selection logic circuit
204, 205, 206 domino circuit group

What is claimed is:

1. A dual rail domino circuit using a combination of a first domino circuit for outputting positive logic and a second domino circuit for outputting negative logic, comprising:
a member for simultaneously fixing an output of the first domino circuit and an output of the second domino circuit at a low level in an evaluation phase in response to a gating control signal inputted from an outside, wherein a logical AND of the gating control signal and an input signal is inputted to the first domino circuit, and a logical NOT of the logical AND of the gating control signal and the input signal is inputted to the second domino circuit.

2. A logic circuit comprising at least one stage of a domino circuit connected at a stage subsequent to the dual rail domino circuit of claim 1, wherein the domino circuit immediately subsequent to the dual rail domino circuit is a domino circuit comprising a member for fixing an output in an evaluation phase at a low level when a signal inputted from a dual rail domino circuit at a previous stage is fixed at the low level, wherein the domino circuit outputs a logical AND of the signal inputted from the dual rail domino circuit at the previous stage and an arbitrary signal, and an output of the domino circuit at the subsequent stage is successively fixed at a low level when the output of the dual rail domino circuit is fixed at the low level.

3. The logic circuit of claim 2, wherein the domino circuit forms a selection logic circuit and the selection logic circuit is controlled by the output of the dual rail domino circuit.

4. The logic circuit of claim 3, wherein a plurality of stages of third domino circuits are connected at subsequent stages.

* * * * *